US008493812B2

(12) United States Patent
Dengler et al.

(10) Patent No.: US 8,493,812 B2
(45) Date of Patent: Jul. 23, 2013

(54) BOOST CIRCUIT FOR GENERATING AN ADJUSTABLE BOOST VOLTAGE

(75) Inventors: Osama Dengler, Boeblingen (DE); Alexander Fritsch, Esslingen (DE); Wolfgang Penth, Holzgerlingen (DE); Juergen Pille, Stuttgart (DE)

(73) Assignee: International Business Machines Corporation, Armonk, NY (US)

( * ) Notice: Subject to any disclaimer, the term of this patent is extended or adjusted under 35 U.S.C. 154(b) by 373 days.

(21) Appl. No.: 12/913,929

(22) Filed: Oct. 28, 2010

(65) Prior Publication Data
US 2012/0106237 A1 May 3, 2012

(51) Int. Cl.
*G11C 8/08* (2006.01)
(52) U.S. Cl.
USPC ............................. 365/230.06; 365/154
(58) Field of Classification Search
USPC .................. 365/185.23, 154, 189.09, 189.11, 365/230.06; 363/60
See application file for complete search history.

(56) References Cited

U.S. PATENT DOCUMENTS

| 5,436,821 | A | * | 7/1995 | Inoue ............................. 363/60 |
| 5,870,295 | A | * | 2/1999 | Watanabe ...................... 363/60 |
| 6,118,326 | A | * | 9/2000 | Singer et al. .................. 327/390 |
| 6,411,531 | B1 | * | 6/2002 | Nork et al. ...................... 363/60 |
| 7,692,978 | B2 | | 4/2010 | Takahashi et al. |
| 2002/0051372 | A1 | * | 5/2002 | Hoshino et al. ................ 363/60 |
| 2002/0196643 | A1 | * | 12/2002 | Appeltans ....................... 363/60 |
| 2003/0020533 | A1 | * | 1/2003 | Price et al. .................... 327/536 |
| 2005/0237848 | A1 | | 10/2005 | Takahashi et al. |
| 2008/0068901 | A1 | * | 3/2008 | Ehrenreich et al. ....... 365/189.11 |

* cited by examiner

*Primary Examiner* — Douglas King
(74) *Attorney, Agent, or Firm* — Yudell Isidore Ng Russell PLLC

(57) ABSTRACT

A technique for generating an adjustable boost voltage for a device includes charging, using first and second switches, a capacitor to a first voltage during a charging phase. The technique also includes stacking, using a third switch, a second voltage onto the first voltage across the capacitor in a boost phase to generate a boost voltage. In this case, the boost voltage is applied to a driver circuit of the device only during the boost phase and at least one of the first and second voltages is adjustable, thereby making the boost voltage adjustable.

12 Claims, 8 Drawing Sheets

BOOST CIRCUIT FOR GENERATING AN ADJUSTABLE BOOST VOLTAGE

BACKGROUND

1. Technical Field

The present invention generally relates to a boost circuit and in particular to a boost circuit that generates an adjustable boost voltage.

2. Description of the Related Art

In integrated circuit design, the trend has been to reduce a supply voltage level for integrated circuits (chips) in order to reduce leakage currents. However, reducing a supply voltage level may result in suboptimal performance for certain circuits within a chip. For example, a supply voltage level is a limiting performance factor for wordline driver circuits (wordline drivers) of complementary metal-oxide semiconductor (CMOS) static random access memory (SRAM). In general, using higher wordline driver circuit voltage levels decreases wordline resistor-capacitor (RC) delay and decreases an on-resistance (Ron) of SRAM passgates. Unfortunately, increasing a global supply voltage level for an SRAM (according to one conventional approach) leads to significantly increased power consumption, even for non-critical circuits in the SRAM. Moreover, implementing multiple different global supply voltages according to another conventional approach leads to increased complexity of power wiring and chip voltage regulation. In general, while both conventional approaches provide a same supply voltage to all memory arrays in a chip, individual macro tuning cannot be achieved with the conventional approaches.

With reference to FIG. 1, U.S. Patent Application Publication No. 2008/0068902 (hereinafter "the '902 publication") discloses a wordline boost circuit 100 that employs a capacitor CB that is charged (by turning switches S3 and S2 on) to a supply voltage VDD level. The voltage on capacitor CB is then stacked onto the supply voltage VDD (by turning switch S1 on and by turning switches S2 and S3 off) when a boost voltage VB is desired (i.e., when a memory access is performed via wordline driver circuit 102, as indicated when a wordline (WL) pulse signal is generated). As is illustrated, switches S1 and S2 are included within inverter I1. In theory, during the voltage boost, wordline drivers are supplied with 2 VDD (which may violate an allowed gate-to-source voltage (Vgs) of a p-channel metal-oxide semiconductor field-effect transistor (MOSFET) of wordline driver circuit 102). In practice, the boost voltage on a wordline depends on a value of the supply voltage VDD, a wordline capacitance value, a value of capacitor CB, and an on-resistance of switch S1, among other parameters. Moreover, in wordline boost circuit 100, a level of the boost voltage VB is not readily ascertainable and is not adjustable (to meet specific system requirements).

BRIEF SUMMARY

Disclosed are a method, a data processing system, and a boost circuit for generating an adjustable boost voltage that may be utilized to improve performance of a device, e.g., a memory.

A technique for generating an adjustable boost voltage for a device includes charging, using first and second switches, a capacitor to a first voltage during a charging phase. The technique also includes stacking, using a third switch, a second voltage onto the first voltage across the capacitor in a boost phase to generate a boost voltage. In this case, the boost voltage is applied to a driver circuit of the device only during the boost phase and at least one of the first and second voltages is adjustable, thereby making the boost voltage adjustable.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

The above as well as additional objectives, features, and advantages of the present invention will become apparent in the following detailed written description.

BRIEF DESCRIPTION OF THE DRAWINGS

The description of the illustrative embodiments is to be read in conjunction with the accompanying drawings, wherein.

DETAILED DESCRIPTION

The illustrative embodiments provide a method, a data processing system, and a boost circuit for generating an adjustable boost voltage that may be utilized to improve performance of an integrated circuit, e.g., a memory. While the discussion herein is primarily directed to generating a boost voltage for a static random access memory (SRAM), it should be appreciated that the techniques disclosed herein are broadly applicable to providing an adjustable boost voltage to other devices.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

It is understood that the use of specific component, device and/or parameter names are for example only and not meant to imply any limitations on the invention. The invention may thus be implemented with different nomenclature/terminology utilized to describe the components/devices/parameters herein, without limitation. Each term utilized herein is to be given its broadest interpretation given the context in which that term is utilized.

Figure 1:
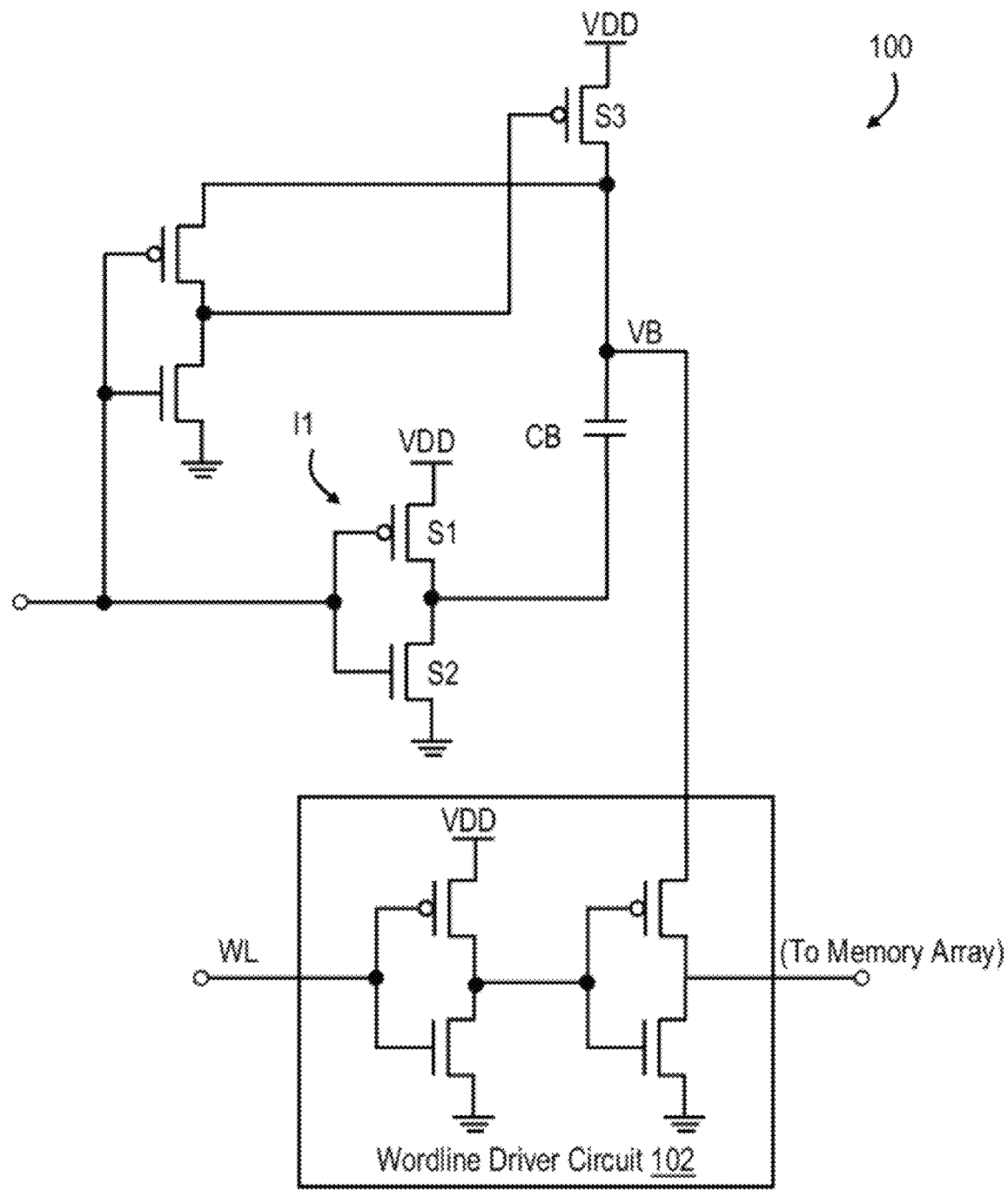
FIG. 1 is a diagram of a relevant portion of a conventional wordline boost circuit.
Figure 2:
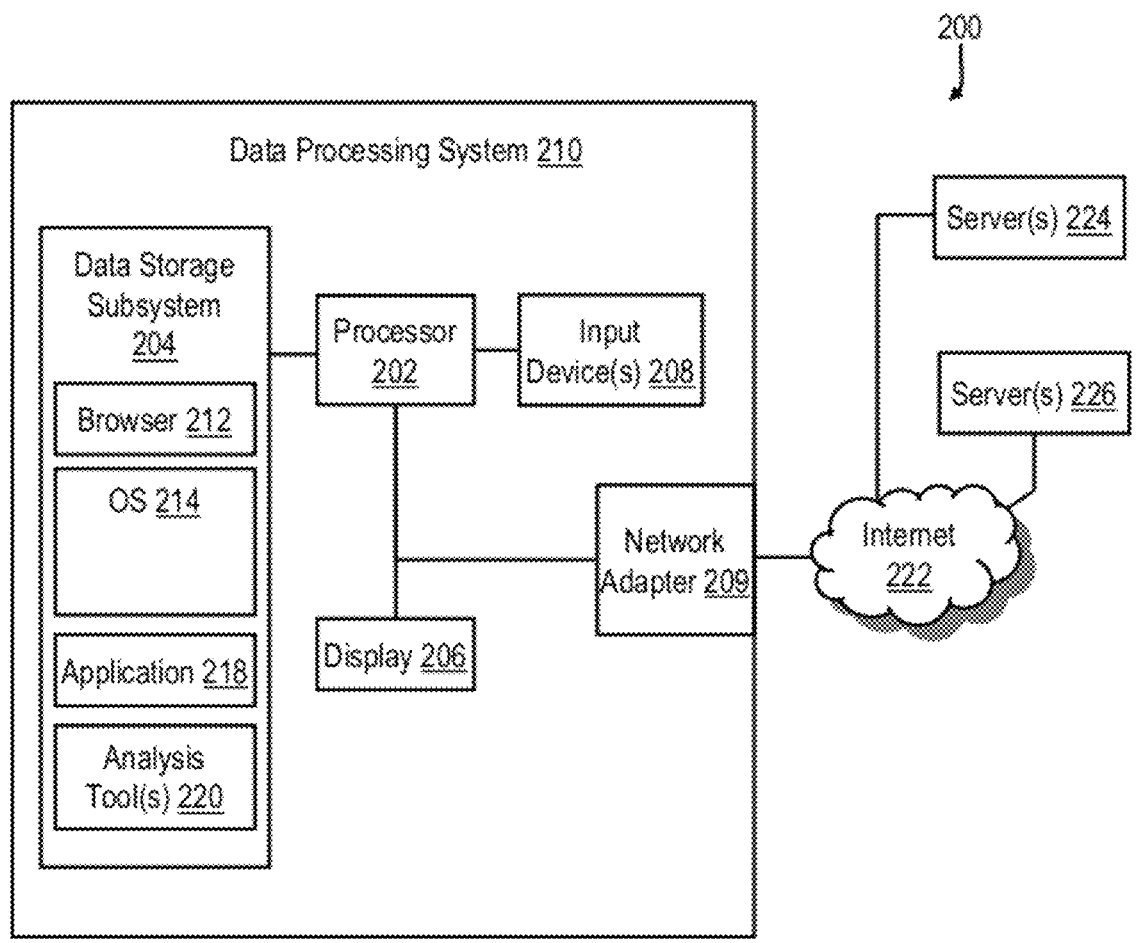
FIG. 2 is a diagram of a relevant portion of an exemplary data processing environment with a data processing system that implements one or more wordline boost circuits configured in accordance with various embodiments of the present disclosure.

With reference to FIG. 2, an exemplary data processing environment 200 is illustrated that includes a data processing system 210 that includes one or more memories that include one or more wordline boost circuits that are configured to generate adjustable boost voltages according to one or more embodiments of the present disclosure. Data processing system 210 may take various forms, such as workstations, laptop computer systems, notebook computer systems, or desktop computer systems and/or clusters thereof Data processing system 210 includes a processor 202 (which may include one or more processor cores for executing program code) coupled to a data storage subsystem 204, a display 206, one or more input devices 208, and a network adapter 209. Data storage subsystem 204 may include, for example, application appropriate amounts of various memories (e.g., dynamic random access memory (DRAM), static RAM (SRAM), and read-only memory (ROM)), and/or one or more mass storage devices, such as magnetic or optical disk drives. Data storage subsystem 204 includes an operating system (OS) 214 for data processing system 210, as well as application programs, such as a browser 212 (which may optionally include customized plug-ins to support various client applications), analysis tool(s) 220 (which may include, for example, verification, simulation, and/or synthesis tools), and other applications (e.g., a word processing application, a presentation application, and an email application) 218.

As is well known, a browser (or web browser) is a software application that allows a user (at a client) to display and interact with text, images, and other information located on a web page at a website (hosted by an application server) on the World Wide Web or a local area network. Text and images on a web page may contain hyperlinks to other web pages at the same or different website. Browsers allow a user to quickly and easily access information provided on web pages at various websites by traversing hyperlinks. A number of different browsers, e.g., Internet Explorer™, Mozilla Firefox™, Safari™, Opera™, and Netscape™, are currently available for personal computers. In general, browsers are the most commonly used type of hypertext transfer protocol (HTTP) user agent. While browsers are typically used to access web application servers (hereinafter "web servers") that are part of the World Wide Web, browsers can also be used to access information provided by web servers in private networks or content in file systems.

Display 206 may be, for example, a cathode ray tube (CRT) or a liquid crystal display (LCD). Input device(s) 208 of data processing system 210 may include, for example, a mouse, a keyboard, haptic devices, and/or a touch screen. Network adapter 209 supports communication of data processing system 210 with one or more wired and/or wireless networks utilizing one or more communication protocols, such as 802.x, HTTP, simple mail transfer protocol (SMTP), etc. Data processing system 210 is shown coupled via one or more wired or wireless networks, such as the Internet 222, to various file servers 224 and various web page servers 226 that provide information of interest to the user of data processing system 210.

Those of ordinary skill in the art will appreciate that the hardware components and basic configuration depicted in FIG. 2 may vary. The illustrative components within data processing system 210 are not intended to be exhaustive, but rather are representative to highlight components that may be utilized to implement the present invention. For example, other devices/components may be used in addition to or in place of the hardware depicted. The depicted example is not meant to imply architectural or other limitations with respect to the presently described embodiments.

According to various aspects of the present disclosure, an adjustable regulated boost voltage is locally generated within an integrated circuit (e.g., a memory). According to one or more embodiments of the present disclosure, a boost capacitor is charged to a supply voltage VDD (provided by a global power supply) and the boost capacitor is then stacked onto an adjustable voltage VDELTA, which may be equal to a reference voltage VREF that may be generated on-chip or off-chip. During a boost, wordline driver circuits are supplied with the boost voltage VBOOST (VBOOST=VDD+VDELTA). The adjustable voltage VDELTA may, for example, be equal to the reference voltage VREF or a fraction thereof. In the usual case, the boost capacitor is selected to be relatively small, but considerably larger than a wordline capacitor (e.g., deep trench capacitor) that is responsible for a wordline capacitance. When the adjustable voltage VDELTA is equal to the reference voltage VREF, the resulting wordline boost voltage substantially depends on a level of the reference voltage VREF and a value of the boost capacitor.

In a typical implementation, the reference voltage VREF can be adjusted (e.g., between zero volts and VDD) in-system to, for example, compensate for process and distribution variations and facilitate power/performance balancing. In various embodiments, the boost voltage VBOOST is regulated, due to implementation of a regulator (e.g., a fast step-down regulator) that can recover charge on the boost capacitor at full SRAM speed (e.g., multi-gigahertz speeds). The boost voltage VBOOST may be adjusted by changing a level of the reference voltage VREF (e.g., by programming a register of a programmable voltage (source) supply to a different value). In general, the disclosed techniques avoid increasing a global supply voltage VDD level to improve performance (which can lead to power issues), do not require an additional higher global supply voltage (which can lead to increased system complexity (in both a chip and associated printed circuit board (PCB))), and facilitate adjustment of the boost voltage VBOOST to meet in-system requirements.

In a typical application, the performance of SRAMs, e.g. instruction and data caches, embedded in microprocessor cores has significant impact on achievable overall system performance. Limiting factors for SRAM access speed are memory array size/area and supply voltage values of SRAM circuitry. The array size is given by the SRAM cell size and the intended core architecture, which are usually considered to be fixed and cannot be changed in-system. As noted above, increasing a voltage of a global power supply to improve memory access speed (according to conventional approaches) leads to increased power consumption, even in circuits that are not performance critical. The introduction of an additional global power supply, whose voltage value is above a voltage value of a main global power supply, leads to more complex power wiring and usually requires a second off-chip voltage regulator. Employing multiple global power supplies also increase the difficulty of accounting for voltage requirements of individual memory arrays and usually requires a particular power-on and power-off sequence of the global supply voltages in order to prevent destructive failing mechanisms during system start-up and system shut-down.

According to various aspects of the present disclosure, in order to influence memory performance on a per macro level, performance critical SRAM circuits are supplied with a boost voltage VBOOST that is adjustable to a value that is higher than a supply voltage VDD. As mentioned above, one performance critical path is the wordline driver circuit, which selects SRAM cells for read and write operations. In general, generating a proper voltage amplitude for a wordline pulse is crucial for achieving a desired access speed. However, a supply voltage for a wordline driver circuit is usually responsible for the largest portion of macro leakage power dissipation. In general, leakage current is not linear with respect to supply voltage (i.e., leakage current increases exponentially with increased supply voltage).

The disclosed wordline boost circuits generate a wordline pulse with a signal amplitude equal to a boost voltage (i.e., VBOOST=VDD+VDELTA), where VDELTA is adjustable in-system. In one or more embodiments, the in-system adjustment of the wordline pulse is accomplished by utilizing a switched step-down regulator to generate VDELTA and a synchronized charge pump to increase an amplitude of a wordline pulse. The boost voltage VBOOST improves a slew rate of the wordline pulse and lowers the on-resistance (Ron) of SRAM passgates connected to the boosted wordline. In various embodiments, only wordline driver circuits that are activated during a memory access are supplied with the boost voltage VBOOST, while inactive wordline driver circuits remain connected to VDD. In this manner, the problems associated with conventional approaches are addressed. It should be appreciated that the techniques disclosed herein are applicable to reducing leakage currents for both on-chip and off-chip memory arrays, as well as other high-speed (e.g., multi-gigahertz) devices. The adjustability of the boost voltage VBOOST on a macro level facilitates granular control over performance and facilitates compensation for CMOS process variations, as well as improving process yields.

In various embodiments, the disclosed boost circuit generates an in-system regulated adjustable voltage VDELTA. When a read or write operation to a memory bank is initiated, the adjustable voltage VDELTA and the global supply voltage VDD are stacked on each other for the duration of the wordline pulse. In various embodiments, the boost voltage VBOOST is local to the activated part of the memory array and is only present for the duration of the memory access. In one or more embodiments, the adjustable voltage VDELTA is generated via a capacitive switched mode regulator, unlike known approaches that have utilized linear series voltage regulators. In general, linear regulators are unable to recover charge losses (in a boost capacitor) between two or more back-to-back memory accesses due to speed and stability issues.

Figure 2A:
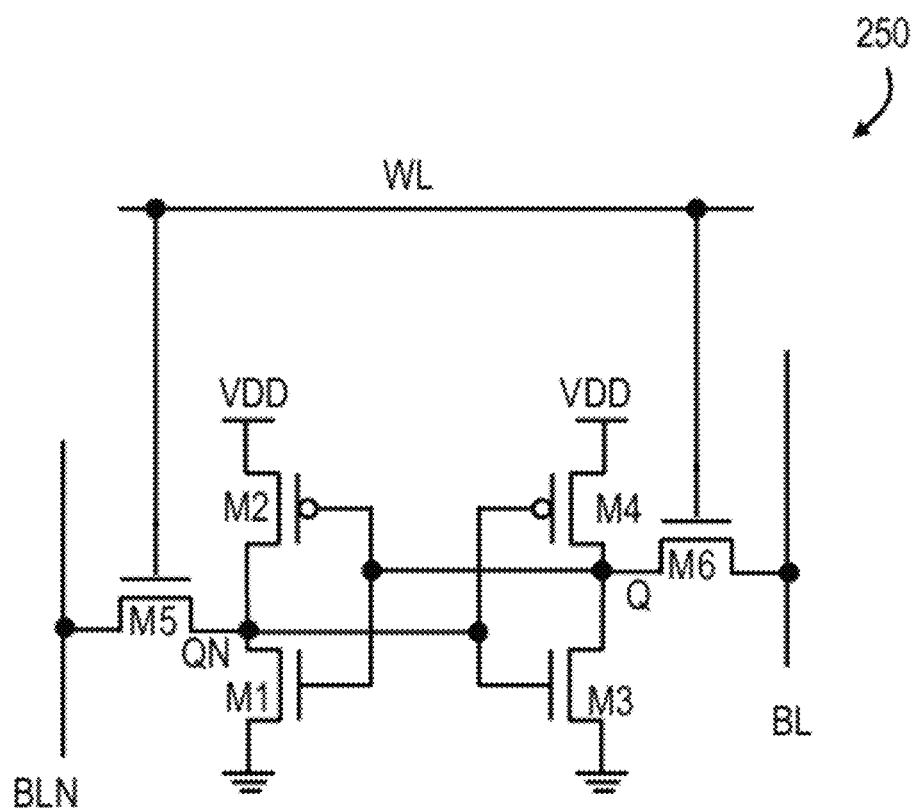
FIG. 2A is a diagram of a relevant portion of an exemplary static random access memory (SRAM) cell whose wordline signal is provided by a wordline boost circuit configured in accordance with various embodiments of the present disclosure.

As is well known, an SRAM is a type of semiconductor memory that does not require periodic refreshing, as SRAMs employ bistable latching circuitry (i.e., cross-coupled inverters) to store each bit. With reference to FIG. 2A, an exemplary single port SRAM cell 250 that includes four transistors M1-M4 that form the cross-coupled inverters and two access transistors M5 and M6 (that facilitate access to the cell during read and write operations) is illustrated. As is also well known, a typical SRAM array may include thousands (or millions) of SRAM cells. Each SRAM cell (only one of which is shown) has two stable states, i.e., a digital one and a digital zero. Access to an SRAM cell is enabled by asserting a wordline (WL) signal on wordline WL. The WL signal controls access transistors M5 and M6 to connect the SRAM cell to bit lines BL and BLN. Bit lines BL and BLN are used to transfer data for both read and write operations. During a read operation, bit lines BL and BLN are driven high and low by inverters in the SRAM cell. The symmetric structure of the SRAM cell allows for differential signaling which facilitates improved detection of small voltage swings.

An SRAM cell may be in one of three different states: standby, where the cell is idle; reading, when data has been requested from the cell; and writing, when cell content is being updated. If wordline WL is not asserted, access transistors M5 and M6 disconnect the cell from bit lines BL and BLN. The two cross-coupled inverters (formed by transistors M1-M4) reinforce each other as long as the cross-coupled inverters are connected to power supply VDD. A read cycle is started by precharging bit lines BL and BLN to a digital one and then asserting wordline WL to enable access transistors M5 and M6. When the content of the cell is a digital one (stored at Q), values stored in Q and QN are transferred by discharging bit line BLN (via transistors M1 and M5) and pulling bit line BL toward power supply VDD (via transistors M4 and M6). If the content of the cell is at a digital zero, bit line BLN is pulled toward power supply VDD (via transistors M2 and M5) and bit line BL is pulled toward a digital zero (via transistors M3 and M6).

In either case, bit lines BL and BLN have a small voltage difference (delta). A sense amplifier (not shown) senses whether bit line BL or bit line BLN has a higher voltage to determine whether a digital one or a digital zero was stored by the cell. A write cycle begins by applying a value to be written to bit lines BL and BLN. To write a digital zero to the cell, a digital zero is applied to bit line BL and a digital one is applied to bit line BLN. A digital one is written by inverting the values on bit lines BL and BLN. Wordline WL is then asserted and the value that is to be stored is latched into the cell. It should be appreciated that bit line input drivers are designed to be substantially stronger than relatively weak transistors in the cell, such that bit line input drivers can easily override a previous state of the cross-coupled inverters.

Figure 3:
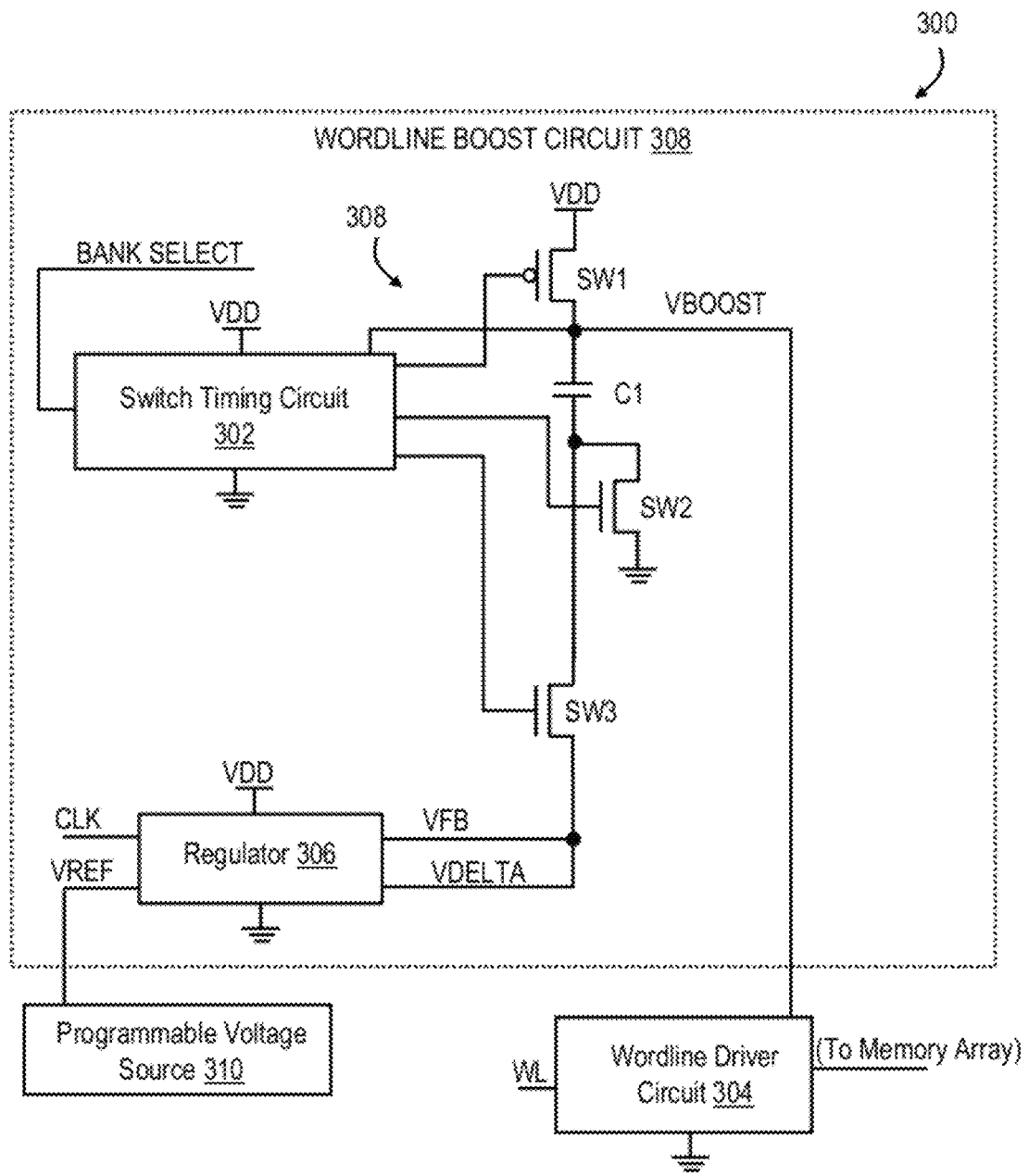
FIG. 3 is a diagram of a relevant portion of an exemplary wordline boost circuit configured in accordance with one embodiment of the present disclosure.

With reference to FIG. 3, a relevant portion of a wordline boost circuit environment 300 is illustrated that includes a wordline boost circuit 308 configured according to an embodiment of the present disclosure. As is shown, wordline boost circuit 308 includes a regulator (e.g., a step-down regulator) 306, switches SW1, SW2, and SW3 (e.g., metal-oxide semiconductor field-effect transistor (MOSFET) devices), a switch timing circuit 302, and a boost capacitor C1. Switch timing circuit 302 receives a bank select signal and controls switches SW1, SW2, and SW3 responsive thereto. The bank select signal (BANK SELECT) may, for example, select one of sixteen memory banks In a typical case, bank select signals are generated by a predecode stage (not shown). To add the supply voltage VDD and the adjustable voltage VDELTA (which is based on a reference voltage VREF supplied by programmable voltage source 310) to obtain the boost voltage VBOOST, capacitor C1 (which is charged to the supply voltage VDD) is stacked onto the adjustable voltage VDELTA during a memory access, as indicated when a wordline (WL) pulse signal is generated.

It should be appreciated that capacitor C1 remains referenced to ground during the charge phase, which is desirable for efficiency and recovery speed of wordline boost circuit 308 during the charge phase. As is illustrated in the embodiment of FIG. 3, a closed local control loop is employed to reduce noise on a voltage feedback VFB node of regulator 306. Logically, regulator 306 is independent from a charge pump (which includes switches SW1 and SW2 and capacitor C1) and, as such, boosting and charging operations can overlap randomly without impact on functionality of wordline boost circuit 308.

In the embodiment illustrated in FIG. 3, the boost voltage VBOOST may be coupled to a gate of switch SW1 (via an inverter (not shown) in switch timing circuit 302) to ensure switch SW1 is off and prevent charge from flowing back to the supply voltage VDD during a boost phase. In a charging phase, switches SW1 and SW2 are turned on and switch SW3 is turned off to connect capacitor C1 between ground and the supply voltage VDD to facilitate charging of capacitor C1. In a typical implementation, a value for capacitor C1 is selected to be relatively small (e.g., about 0.5-2 picofarads) to facilitate rapid charging. In the boost phase, switches SW1 and SW2 are turned off and switch SW3 is turned on to stack capacitor C1 onto the supply voltage VDD and provide the boost voltage VBOOST to wordline driver circuit 304.

In various embodiments, switch timing circuit 302 may be configured to optimize switching to improve efficiency. In a typical implementation, the boost voltage VBOOST is generated slightly before (e.g., a few picoseconds) a wordline (WL) pulse signal is generated. In a typical implementation, a portion of the charge that is pushed into a wordline supply plane during a boost operation is recycled, thus, accelerating recovery of voltages stored on boost capacitor C1 and improving efficiency. In general, wordline boost circuit 308 may be seamlessly integrated into a memory by using the same type of transistor devices as surrounding logic (which advantageously avoids usage of body-contacted devices and the integration challenges (e.g., additional processing steps) associated therewith).

In general, wordline boost circuit 308 can achieve complete recovery of charge storing devices between back-to-back memory accesses at full speed (e.g., at a simulation cycle time of 200 picoseconds), via utilization of an optimized switched step-down regulator topology. In various embodiments, the boost voltage VBOOST is regulated and has a predictable accuracy, which is desirable for realistic calculation of memory access timing. The switched step-down regulator topology provides flexibility in the sizing of the charging devices (i.e., metal-oxide semiconductor field-effect transistor (MOSFET) devices and capacitors) and readily facilitates adaption to the memory in which the wordline boost circuit is to be operated. The incorporated control loop (VFB) eliminates most saturation voltage (Vsat) losses of the switching devices and wire parasitic losses and contributes to relatively fast recovery. In various embodiments, the boost voltage VBOOST can be adapted to the requirements of a specific macro without influencing other macros or can be exploited to compensate for performance variability and, in this manner, increase yield.

Figure 4:
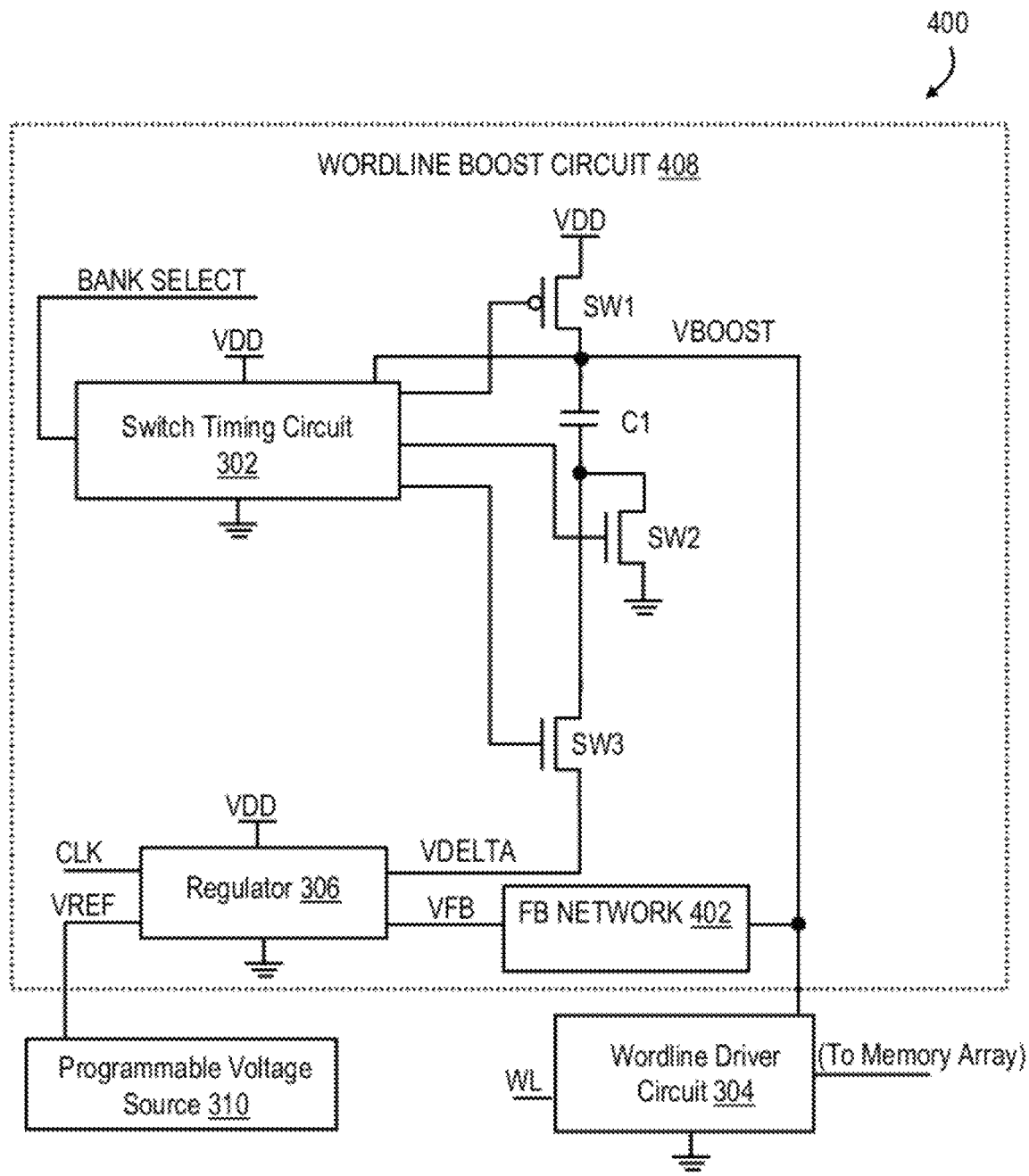
FIG. 4 is a diagram of a relevant portion of an exemplary wordline boost circuit configured in accordance with another embodiment of the present disclosure.

With reference to FIG. 4, a relevant portion of a wordline boost circuit environment 400 is illustrated that includes a wordline boost circuit 408 configured according to another embodiment of the present disclosure. Wordline boost circuit 408, while similar to wordline boost circuit 308, addresses losses in capacitor C1 and switching devices by feeding back a fraction of the boost voltage VBOOST (via feedback network 402) to regulator 306, as contrasted with feeding the adjustable voltage VDELTA back to regulator 306. When feedback network 402 employs a resistive voltage divider to acquire the voltage feedback (VFB) signal for regulator 306, an amplitude of the boost voltage VBOOST pulse depends on a voltage divider ratio 'k' and reference voltage VREF (assuming VREF is equal to VDELTA). If a sample-and-hold circuit is used to track the voltage difference between the boost voltage VBOOST and the supply voltage VDD, an amplitude of the boost voltage VBOOST pulse only depends on the supply voltage VDD and the reference voltage VREF (assuming VREF is equal to VDELTA). In the embodiment of FIG. 4, it may be desirable to implement a standby circuit to provide a feedback signal to regulator 306 when no boost occurs.

Figure 5:
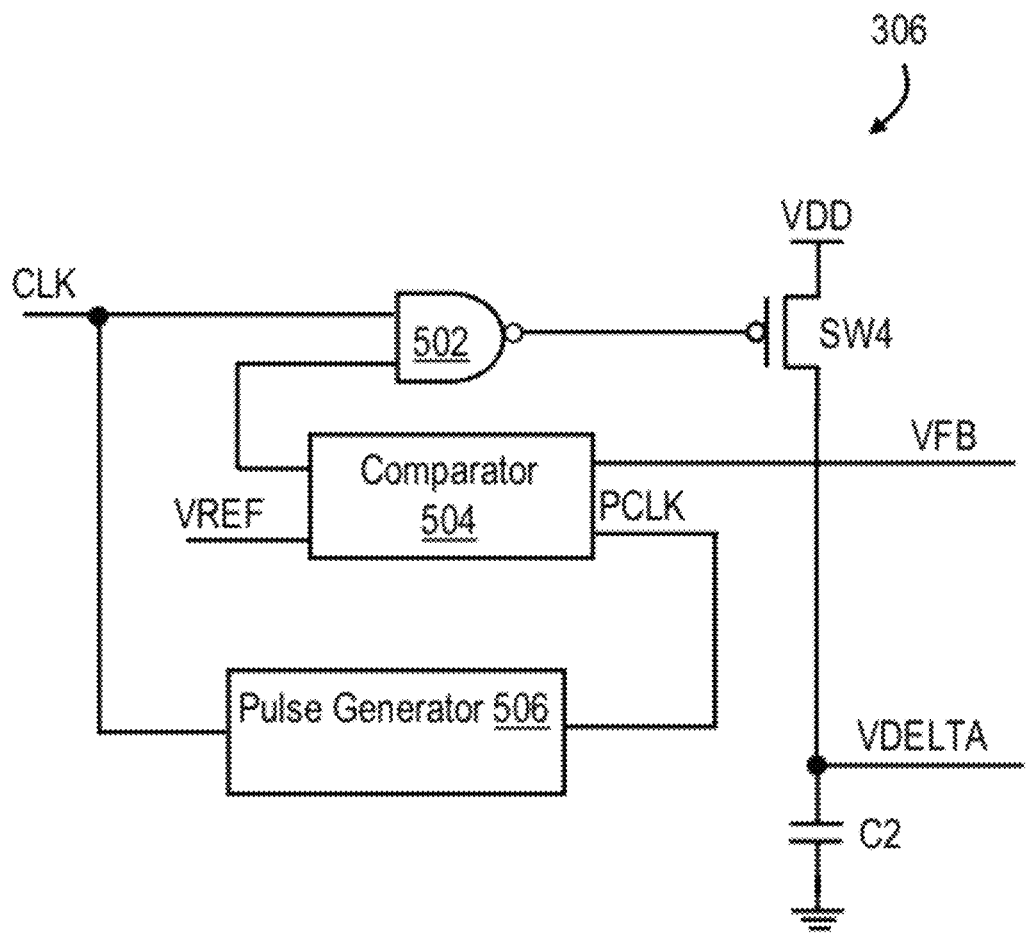
FIG. 5 is a diagram of a relevant portion of an exemplary regulator that may be employed in the wordline boost circuits of FIGS. 3 and 4.

With reference to FIG. 5, an exemplary embodiment of regulator 306 is illustrated. As shown in FIG. 5, a NAND gate 502 includes a first input, a second input, and an output. The first input of NAND gate 502 receives a system clock (CLK) signal and the second input of NAND gate 502 is coupled to an output of comparator 504, which is configured to compare (when a pulse clock (PCLK) signal is asserted) the VFB signal with the VREF signal (or a fraction thereof) to determine whether adjustment of the adjustable voltage VDELTA is required. The output of NAND gate 502 is coupled to a control input of switch SW4. A drain of switch SW4 is coupled to supply voltage VDD and a source of switch SW4 is coupled to a first terminal of capacitor C2. A second terminal of capacitor C2 is coupled to ground.

A pulse generator 506 generates the PCLK signal responsive to the CLK signal. In general, pulse generator 506 is configured to narrow a pulse width of the CLK signal to lower power requirements. For example, the CLK signal may have a fifty percent duty cycle and pulse generator 506 may generate the PCLK signal with a duty cycle between about ten and twenty percent responsive to the CLK signal. When switch SW4 is turned on, capacitor C2 charges to VDELTA (which may be equal to the VREF signal or a fraction thereof).

Figure 6:
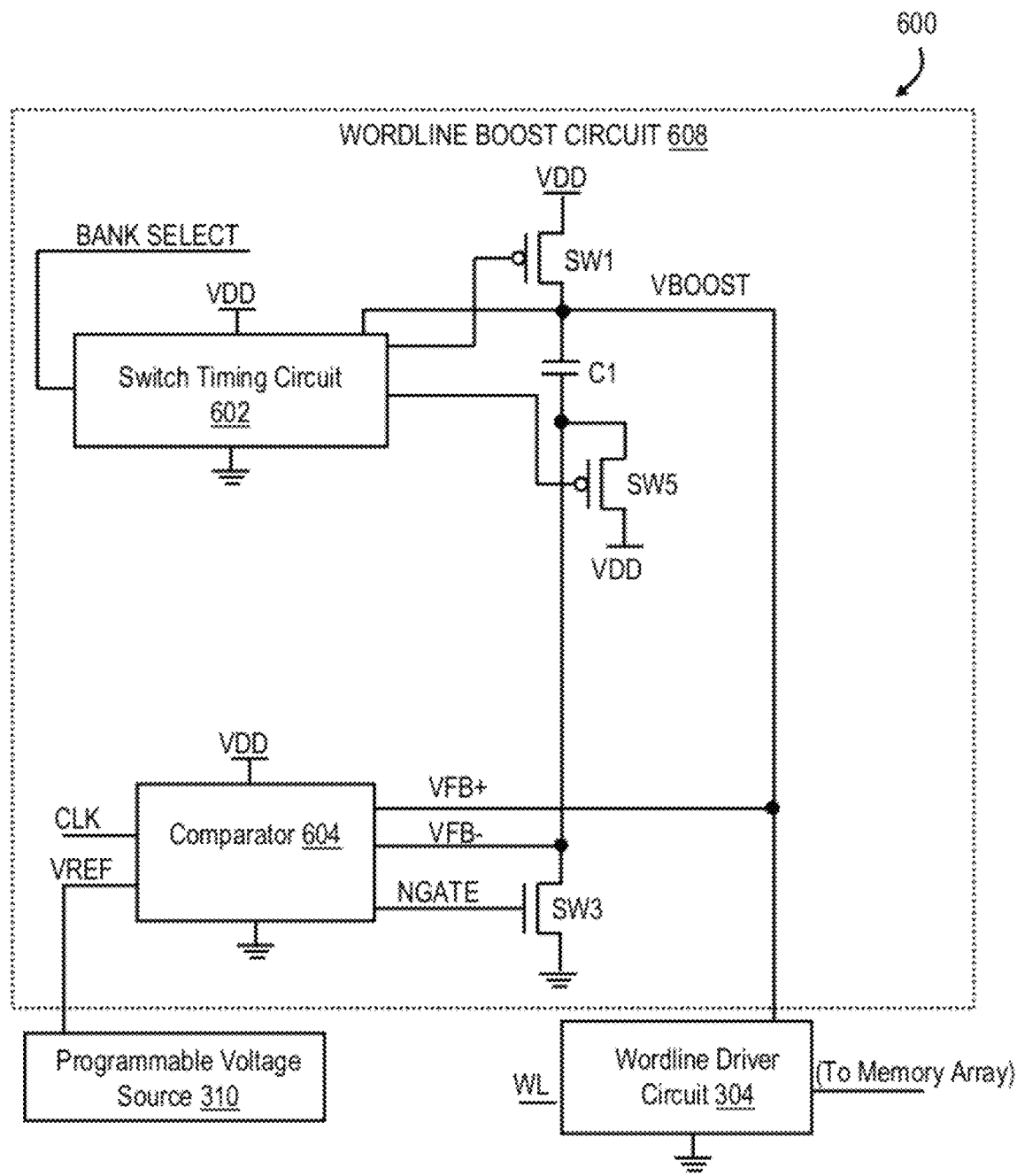
FIG. 6 is a diagram of a relevant portion of an exemplary wordline boost circuit configured in accordance with yet another embodiment of the present disclosure.

With reference to FIG. 6, a relevant portion of an exemplary wordline boost circuit environment 600 is illustrated that includes a wordline boost circuit 608 configured according to another embodiment of the present disclosure. In wordline boost circuit 608, part count is reduced. For example, only a single capacitor (i.e., capacitor C1) is implemented for voltage translation (i.e., capacitor C2 illustrated in FIG. 5 is not implemented) and regulator 306 and charge pump (including switches SW1 and SW2 and capacitor C1) of FIGS. 3 and 4 are consolidated. In wordline boost circuit 608, capacitor C1 is charged to the adjustable voltage VDELTA (as contrasted with the supply voltage VDD), which is stacked onto the supply voltage VDD (via switch SW5) to generate the boost voltage VBOOST under the control of switch timing circuit 602.

A differential feedback signal (VBOOST−VDD) is provided to comparator 604. In this case, the voltage on capacitor C1 is adjusted to keep the difference between the differential feedback signal constant (i.e., equal to the adjustable voltage VDELTA or the reference voltage VREF, when VREF=VDELTA). Capacitor C1 charges when switches SW1 and SW3 are turned on and switch SW5 is turned off. During a boost phase, switches SW1 and SW3 are turned off and switch SW5 is turned on. In the embodiment of FIG. 6, switch SW3 is controlled by an NGATE signal generated by comparator 604 and switch SW3 is turned off when the adjustable voltage VDELTA is met. It should be appreciated that if a capacitor is not located across voltage feedback nodes VFB+ and VFB− of comparator 604, body-contacted devices may need to be employed in wordline boost circuit 608. In contrast to the embodiment of FIG. 3, all losses are transparent and can, therefore, be compensated. In the embodiment of FIG. 6, it may be desirable to provide a standby circuit that provides voltage feedback signals to comparator 604 when wordline boost circuit 608 is not providing a boost voltage.

Figure 7:
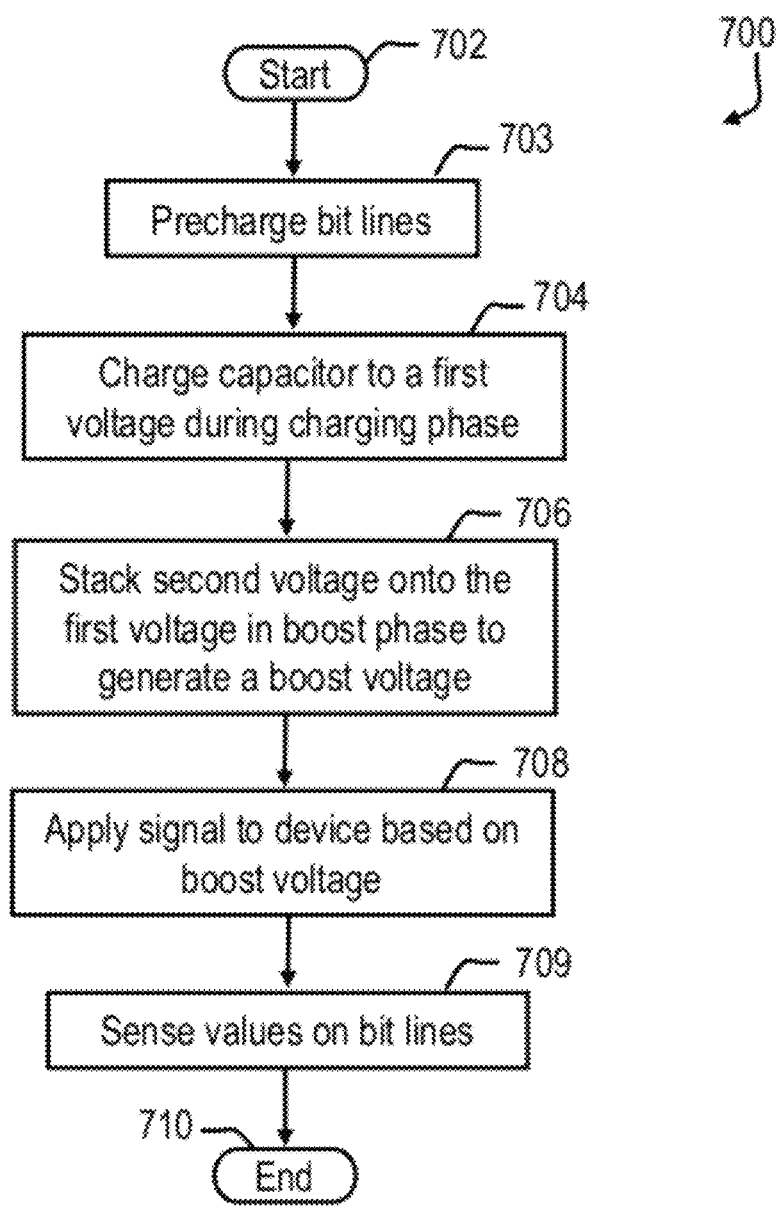
FIG. 7 is a flow chart for an exemplary process that generates boost voltages according to various embodiments of the present disclosure.

With reference to FIG. 7, a flow chart for an exemplary process 700 that generates boost voltages according to various embodiments of the present disclosure is illustrated. Process 700 is described in conjunction with a read operation on an SRAM cell (see FIG. 2A). Process 700 begins at block 702, when a read operation is indicated, and then proceeds to block 703. In block 703 a read operation is initiated by precharging bit lines BL and BLN. In block 704 capacitor C1 (see FIGS. 3, 4, and 6) is charged to a first voltage in a charging phase. In the embodiments depicted in FIGS. 3 and 4, the first voltage corresponds to the supply voltage VDD. In the alternative embodiment depicted in FIG. 6, the first voltage corresponds to the adjustable voltage VDELTA.

Next, in block 706, a second voltage is stacked onto the first voltage in a boost phase to provide a boost voltage. In the embodiments of FIGS. 3 and 4, the second voltage corresponds to the adjustable voltage VDELTA. In this case, the second voltage is generated by regulator 306 based on a reference voltage VREF and a voltage feedback VFB signal. The reference voltage VREF may be generated by, for example, programmable voltage source 310 and a value of the reference voltage VREF may be macro specific. In the alternative embodiment shown in FIG. 6, the second voltage corresponds to the supply voltage VDD. In this case, the first voltage is generated by comparator 604 based on the reference voltage VREF and voltage feedback VFB+ and VFB− signals. As above, the reference voltage VREF may be generated by, for example, programmable voltage source 310 and a value of the reference voltage VREF may be macro specific. Then, in block 708, a signal (e.g., a WL pulse signal) is applied to a device based on the boost voltage. Asserting a wordline WL of SRAM cell 250 causes access transistors M5 and M6 to connect SRAM cell 250 to bit lines BL and BLN. Next, in block 709, values on bit lines BL and BLN are sensed and an indication of whether a digital zero or a digital one is stored by SRAM cell 250 is provided by a sense amplifier. Following block 709, process 700 ends at block 710.

In the flow chart above, the method depicted in FIG. 7 may be performed in an integrated circuit, such as an integrated circuit that includes memory. In addition, the method may be embodied in a computer-readable medium containing computer-readable code such that a series of steps are performed when the computer-readable code is executed on a computing device. In some implementations, certain steps of the methods may be combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer-readable medium(s) having computer-readable program code embodied thereon.

Any combination of one or more computer-readable medium(s) may be utilized. The computer-readable medium may be a computer-readable signal medium or a computer-readable storage medium. A computer-readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer-readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer-readable storage medium may be any tangible storage medium that can contain, or store a program for use by or in connection with an instruction execution system, apparatus, or device.

A computer-readable signal medium may include a propagated data signal with computer-readable program code embodied therein, for example, in baseband or as part of a carrier wave. Such a propagated signal may take any of a variety of forms, including, but not limited to, electro-magnetic, optical, or any suitable combination thereof. A computer-readable signal medium may be any computer-readable medium that is not a computer-readable storage medium and that can communicate, propagate, or transport a program for use by or in connection with an instruction execution system, apparatus, or device. Program code embodied on a computer-readable signal medium may be transmitted using any appropriate medium, including but not limited to wireless, wireline, optical fiber cable, RF, etc., or any suitable combination of the foregoing.

Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described herein with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

The computer program instructions may also be stored in a computer-readable storage medium that can direct a computer, other programmable data processing apparatus, or other devices to function in a particular manner, such that the instructions stored in the computer-readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

As will be further appreciated, the processes in embodiments of the present invention may be implemented using any combination of software, firmware or hardware. As a preparatory step to practicing the invention in software, the programming code (whether software or firmware) will typically be stored in one or more machine readable storage mediums such as fixed (hard) drives, diskettes, optical disks, magnetic tape, semiconductor memories such as ROMs, PROMs, etc., thereby making an article of manufacture in accordance with the invention. The article of manufacture containing the programming code is used by either executing the code directly from the storage device, by copying the code from the storage device into another storage device such as a hard disk, RAM, etc., or by transmitting the code for remote execution using transmission type media such as digital and analog communication links. The methods of the invention may be practiced by combining one or more machine-readable storage devices containing the code according to the present invention with appropriate processing hardware to execute the code contained therein. An apparatus for practicing the invention could be one or more processing devices and storage systems containing or having network access to program(s) coded in accordance with the invention.

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated.

What is claimed is:

1. A method for generating an adjustable boost voltage for a device, comprising: charging, using first and second switches, a capacitor to a first voltage during a charging phase; stacking, using a third switch, a second voltage onto the first voltage across the capacitor in a boost phase to generate a boost voltage; and applying the boost voltage to a driver circuit of the device only during the boost phase, wherein at least one of the first and second voltages is adjustable, thereby making the boost voltage adjustable, and wherein the second voltage is generated, using a regulator, and being based on a reference voltage and a feedback signal, wherein the reference voltage is generated by a programmable voltage source, and wherein a value of the reference voltage is macro specific.

2. The method of claim 1, wherein the device includes a static random access memory (SRAM) array, the regulator is a step-down regulator, and the adjustable boost voltage is coupled to the driver circuit during a memory operation associated with a wordline of the SRAM array.

3. The method of claim 1, further comprising:
   adjusting the first voltage to address process variations.

4. The method of claim 1, further comprising:
   adjusting the second voltage to address process variations.

5. The method of claim 1, wherein the first, second, and third switches are metal-oxide semiconductor field-effect transistors.

6. An integrated circuit, comprising: a wordline boost circuit for generating an adjustable boost voltage, the wordline boost circuit comprising: a capacitor; first and second switches configured to couple the capacitor to a first voltage during a charging phase; a third switch configured to stack a second voltage onto the first voltage across the capacitor in a boost phase to generate a boost voltage; a driver circuit coupled to receive the boost voltage only during the boost phase, wherein at least one of the first and second voltages is adjustable, thereby making the boost voltage adjustable; and a regulator configured to generate the second voltage based on a reference voltage and a feedback signal, wherein the reference voltage is generated by a programmable voltage source, and wherein a value of the reference voltage is macro specific.

7. The integrated circuit of claim 6, further comprising:
   a static random access memory (SRAM) array, wherein the regulator is a step-down regulator and the adjustable boost voltage is coupled to the driver circuit during a memory operation associated with a wordline of the SRAM array.

8. The integrated circuit of claim 6, wherein the first voltage is adjusted to address process variations.

9. The integrated circuit of claim 6, wherein the second voltage is adjusted to address process variations.

10. The integrated circuit of claim 6, wherein the first, second, and third switches are metal-oxide semiconductor field-effect transistors.

11. A data processing system, comprising: a processor core; a memory coupled to the processor core, wherein the memory includes: a memory array; and a wordline boost circuit for generating an adjustable boost voltage for the memory array, the wordline boost circuit comprising: a capacitor; first and second switches configured to couple the capacitor to a first voltage during a charging phase; a third switch configured to stack a second voltage onto the first voltage across the capacitor in a boost phase to generate a boost voltage; a driver circuit coupled to receive the boost voltage only during the boost phase, wherein at least one of the first and second voltages is adjustable, thereby making the boost voltage adjustable; and a regulator configured to generate the second voltage based on a reference voltage and a feedback signal, wherein the reference voltage is generated by a programmable voltage source and a value of the reference voltage is macro specific, and wherein the memory array is a static random access memory (SRAM) array, the regulator is a step-down regulator, and the adjustable boost voltage is coupled to the driver circuit during a memory operation associated with a wordline of the SRAM array.

12. The data processing system of claim 11, wherein the one of the first and second voltages is adjusted to address process variations, and wherein the first, second, and third switches are metal-oxide semiconductor field-effect transistors.

* * * * *